United States Patent
Benefield et al.

(10) Patent No.: US 10,834,829 B1
(45) Date of Patent: Nov. 10, 2020

(54) VARIABLE INDUCTOR THROUGH ELECTROCHEMICALLY CONTROLLED CAPILLARITY

(71) Applicant: International Business Machines Corporation, Armonk, NY (US)

(72) Inventors: Stuart B. Benefield, Durham, NC (US); Samuel R. Connor, Apex, NC (US); Matthew S. Doyle, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/550,403

(22) Filed: Aug. 26, 2019

(51) Int. Cl.
| | |
|---|---|
| A61N 1/16 | (2006.01) |
| A61N 2/02 | (2006.01) |
| A61K 9/19 | (2006.01) |
| H05K 3/40 | (2006.01) |
| H01Q 1/36 | (2006.01) |

(52) U.S. Cl.
CPC ........... *H05K 3/4046* (2013.01); *H01Q 1/364* (2013.01)

(58) Field of Classification Search
USPC ................ 174/262; 424/1.11, 422, 423, 489; 600/8; 607/116
See application file for complete search history.

(56) References Cited

U.S. PATENT DOCUMENTS

| | | | | |
|---|---|---|---|---|
| 4,528,851 A | * | 7/1985 | Ozols | H01H 29/002 200/61.46 |
| 4,545,368 A | * | 10/1985 | Rand | A61N 1/406 600/12 |
| 6,577,118 B2 | | 6/2003 | Parent et al. | |
| 8,198,548 B2 | | 6/2012 | Hardin et al. | |
| 8,587,493 B2 | | 11/2013 | Dickey et al. | |
| 9,176,000 B2 | | 11/2015 | Surman et al. | |
| 9,658,178 B2 | | 5/2017 | Surman et al. | |
| 9,899,732 B2 | | 2/2018 | Urcia, Jr. et al. | |
| 2004/0210289 A1 | * | 10/2004 | Wang | B82Y 25/00 607/116 |
| 2005/0079132 A1 | * | 4/2005 | Wang | B82Y 20/00 424/1.11 |
| 2011/0181278 A1 | * | 7/2011 | Chen | G01V 3/32 324/303 |

(Continued)

OTHER PUBLICATIONS

Assadsangabi et al, "Ferrofluid-Based Variable Inductor", MEMS 2012, Paris, France, Jan. 29-Feb. 2, 2012, pp. 1121-1124.

(Continued)

*Primary Examiner* — Xiaoliang Chen
(74) *Attorney, Agent, or Firm* — Patterson + Sheridan, LLP

(57) ABSTRACT

Embodiments herein describe a variable inductor containing a capillary. The capillary includes an eutectic conductive liquid (e.g., EGaIn) containing suspended magnetic particles and an electrolyte (e.g., NaOH). In one embodiment, the variable inductor has a pair of electrodes (e.g., negative and positive electrodes) at the respective ends of the capillary to seal the eutectic conductive liquid and the electrolyte. The variable inductor also includes an inductor coil disposed around the capillary, and the inductor coil is connected to a circuit and provides inductance for the connected circuit. Using a DC voltage between the pair of electrodes, the eutectic conductive liquid can extend inside the capillary, which in turn, causes the variable inductor to have a desired inductance.

7 Claims, 3 Drawing Sheets

(56) References Cited

U.S. PATENT DOCUMENTS

2014/0339219 A1* 11/2014 Ignatowski ............. H05B 6/42
                                                      219/617
2016/0122888 A1   5/2016  Dickey et al.
2018/0019049 A1   1/2018  Lazarus et al.

OTHER PUBLICATIONS

El Gmati et al, "Fabrication and Evaluation of an On-Chip Liquid Micro-Variable Inductor", Journal of Micromechanics and Microengineering, vol. 21, No. 2, 2011, 025018, 9 pages.
Assadsangabi et al., "Planar variable inductor controlled by ferrofluid actuation," IEEE Transactions on Magnetics, vol. 49, No. 4, 2012, pp. 1402-1406.

* cited by examiner

US 10,834,829 B1

VARIABLE INDUCTOR THROUGH ELECTROCHEMICALLY CONTROLLED CAPILLARITY

BACKGROUND

The present invention relates to variable inductors, and more specifically, to using a capillary of eutectic conductive liquid to vary the inductance of a variable inductor.

Conventional reconfigurable electrical circuit components have employed switched electro-mechanical circuit elements (e.g., diodes and varactors) to change its properties. However, these reconfigurable electrical circuit components have a limited number and range of states. To construct more versatile systems, liquid metals have recently been used in a variety of reconfigurable components (e.g., reconfigurable antennae). While the enhanced control over the length provided by the liquid metal greatly enhances the range and precision of the devices, the introduction of pumps and microfluidic elements adds to system complexity and requires a closed fluid path, limiting the device topology.

Gallium alloys have attracted attention for reconfigurable electronics because of their liquid state at room temperature and their non-toxicity compared to mercury. For example, eutectic gallium indium (EGaIn) is an eutectic (lowest melting point composition) of gallium (75%) and indium (25%) with a conductivity of $3.4 \times 10^6$ S/m. Although EGaIn reacts with air to form a surface oxide that can stick to surfaces including the inner walls of capillaries, this adhesion can be avoided by injecting the metal into capillaries pre-filled with electrolyte. The electrolyte forms a slip layer between the oxide and the walls of the capillary. While promising, EGaIn capillaries need to integrate with electrical circuit components in order to control the values and states of these electrical circuit components.

SUMMARY

One embodiment of the present disclosure is a variable inductor that includes a capillary comprising a side surface forming an annulus, wherein an eutectic liquid is disposed within the annulus formed by the side surface, the eutectic liquid comprising suspended magnetic particles; a first electrode disposed at a first end of the capillary; a second electrode disposed at a second end of the capillary; and an inductor coil disposed around the capillary.

Another embodiment of the present disclosure is a circuit that includes a variable inductor. The variable inductor includes a capillary comprising a side surface forming an annular cylinder, wherein an eutectic liquid and an electrolyte are disposed within an aperture formed by the side surface; a negative electrode disposed at a first end of the capillary; a positive electrode disposed at a second end of the capillary; and an inductor coil disposed around the capillary. The circuit also includes a control circuit configured to control DC voltages on the negative electrode and the positive electrode, so that the eutectic liquid extends a particular length into the annular cylinder of the capillary.

Another embodiment of the present disclosure is a method that includes identifying a desired inductance of the variable inductor, the variable inductor comprising a capillary, an inductor coil wrapped around the capillary, and an eutectic liquid disposed inside the capillary; determining a voltage bias that causes the eutectic liquid to extend from a first end of the capillary to a second end that results in the desired inductance; and applying the voltage bias to a pair of electrodes disposed on the first and second ends.

DETAILED DESCRIPTION

Embodiments herein describe a variable inductor containing a capillary. The capillary includes an eutectic conductive liquid (e.g., EGaIn) containing suspended magnetic particles. The capillary can also include an electrolyte (e.g., NaOH). In one embodiment, the variable inductor has a pair of electrodes (e.g., negative and positive electrodes) at the respective ends of the capillary to seal the eutectic conductive liquid containing suspended magnetic particles and the electrolyte. The variable inductor also includes an inductor coil disposed around the capillary, and the inductor coil is connected to a circuit (e.g., a tuning circuit) and provides inductance for the connected circuit. Using a DC voltage between the pair of electrodes, the eutectic conductive liquid containing suspended magnetic particles can extend inside the capillary, which in turn, causes the variable inductor to have a desired inductance. By controlling the length the eutectic conductive liquid containing suspended magnetic particles extends inside the capillary of the variable inductor, the variable inductor can vary how much inductance is applied to the circuit. For example, the variable inductor can provide inductance for DC-DC power converters, power filters, RF filters, and any other circuit element that benefits from adjusting inductance value of an inductor. In other examples, the variable inductor can be used to fine tune inductance values by comparing measured data to simulated data. Another example involves temperature and humidity of the environment: as water is absorbed over time into the circuit board, the dielectric constant will drift and the variable inductor can adjust accordingly in near real time to compensate for the drifting dielectric constant.

Figure 1:
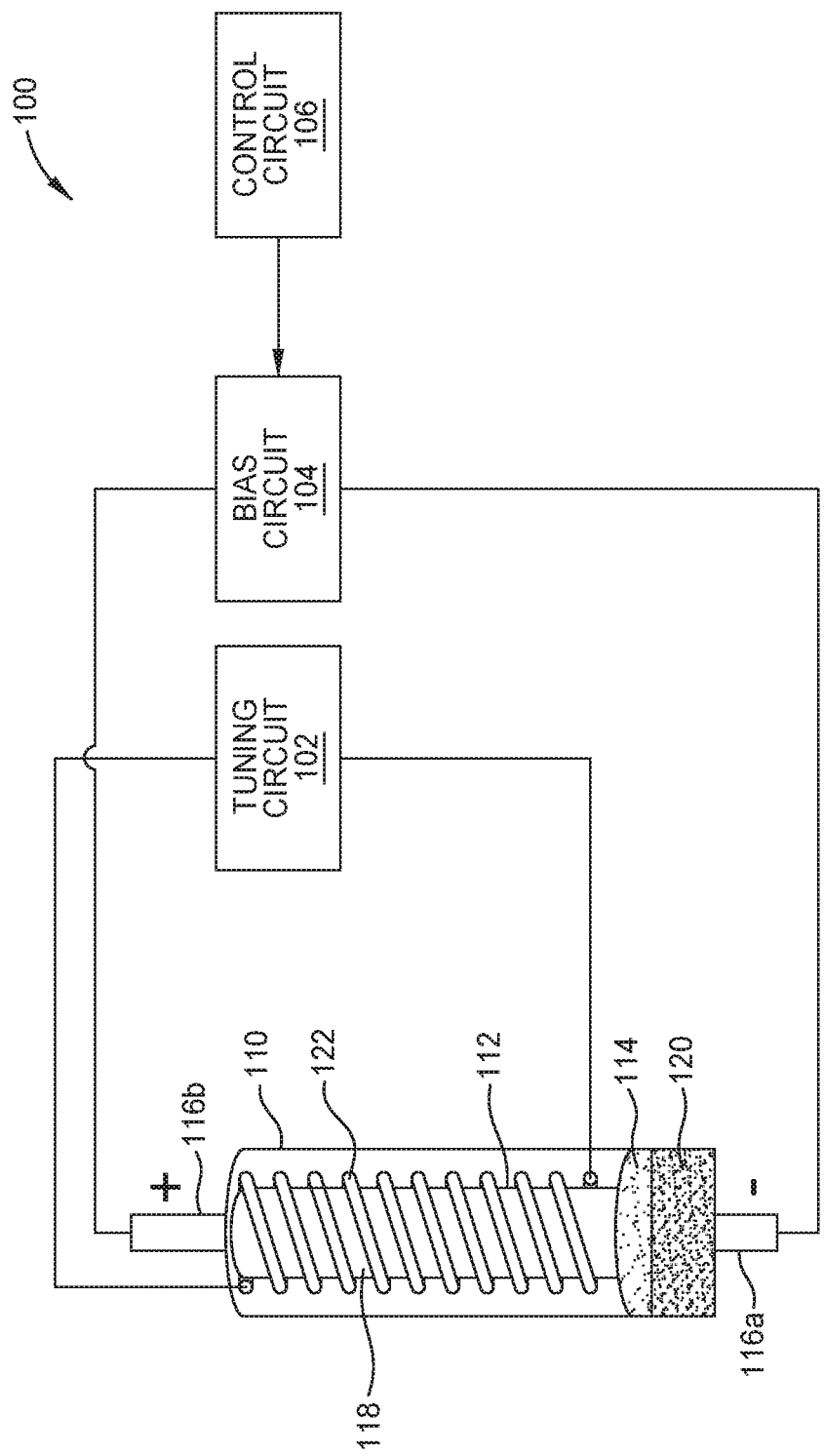
FIG. 1 illustrates a circuit connected to a variable inductor with a capillary and eutectic conductive liquid, according to one embodiment described herein.

FIG. 1 illustrates a circuit 102 connected to a variable inductor 110 with a capillary 112 and eutectic conductive liquid 114 containing suspended magnetic particles, according to one embodiment described herein. The circuit 102 can include other components (not illustrated), and is electrically connected to the variable inductor 110. In some embodiments, the variable inductor 110 is electrically connected to a bias circuit 104 and to a control circuit 106. The variable inductor 110 can be embedded in a PCB or can be used as a surface mount component.

The variable inductor 110 comprises a capillary 112 with a pair of electrodes 116 disposed on the ends of the capillary 112. In some embodiments, the pair of electrodes 116 comprises a negative electrode 116a disposed at a first end of the capillary 112 and a positive electrode 116b is disposed on a second end of capillary 112. As used herein, electrodes 116a and 116b can be referred to generally as electrodes 116. A control circuit 106 (which can be disposed on a PCB (not illustrated) or external thereof) controls the voltage applied to the electrodes 116 in order to control the length of the eutectic conductive liquid 114 extending from the negative electrode 116a in the capillary 112. For example, if the control circuit 106 applies a negative voltage and the pair of electrodes are reversed biased (e.g., the negative electrode 116a has a higher voltage than the positive electrode 116b), the eutectic conductive liquid 114 containing suspended magnetic particles pools at the first end of the capillary 112 near the negative electrode 116a. However, when the control circuit 106 applies a positive voltage and the electrodes 116 are forward biased (e.g., the negative electrode 135 has a lower voltage than the positive electrode 116b), the eutectic conductive liquid 114 containing suspended magnetic particles begins to extend up toward the positive electrode 116b. The length at which the eutectic conductive liquid 114 containing suspended magnetic particles extends in the capillary 112 can be controlled by the voltage difference between the electrodes 116. That is, different positive bias voltages cause the liquid 114 to extend different lengths within the capillary 112. For example, a stronger/higher positive voltage causes the eutectic conductive liquid 114 to extend closer to the positive electrode 116b than a weaker/smaller positive voltage bias. In some embodiments, a bias circuit 104 (which can be disposed on a PCB (not illustrated) or external thereof) is connected to the electrodes 116 and supplies the voltage difference between the electrodes 116. In such embodiments, the bias circuit 104 includes a power supply (not illustrated) which supplies the voltage difference, and the control circuit 106 controls the voltage difference supplied and applied by the bias circuit 104 to the electrodes 116.

By applying or removing a DC voltage, the length the eutectic conductive liquid 114 containing suspended magnetic particles extends in the capillary 112 is controlled to either extend the eutectic conductive liquid 114 containing suspended magnetic particles from the negative electrode 116a towards the positive electrode 116b, or conversely, to shorten the length of the eutectic conductive liquid 114 containing suspended magnetic particles in a direction toward the positive electrode 116b. In some embodiments, the polarity of the electrodes 116 is reversed so that the negative electrode 116a is disposed on the second end of the capillary 112, and the positive electrode 116b is disposed on the first end of the capillary 112.

Oxidation of the leading surface of the eutectic conductive liquid 114 containing suspended magnetic particles can lower the interfacial tension of the eutectic conductive liquid 114 containing suspended magnetic particles. The capillary 112 can be tuned such that the Laplace pressure of the eutectic conductive liquid 114 causes the eutectic conductive liquid 114 containing suspended magnetic particles to flow upwards in the capillary 112 and electrical length increases. Reversing the polarity of the DC potential electrochemically reduces the oxide layer at the leading surface and returns the eutectic conductive liquid 114 to a state of large tension (a process called "capillarity"). In the absence of the oxide layer, Laplace pressure moves the eutectic conductive liquid 114 containing suspended magnetic particles towards the positive electrode 116b shortening the metal filament and filling the vacated space with the electrolyte 118.

As the positive DC voltage between the electrodes 116 increases, the eutectic conductive liquid 114 containing suspended magnetic particles extends up towards the positive electrode 116b As the eutectic conductive liquid 114 containing suspended magnetic particles extends up towards the positive electrode 116b inside the capillary 112, the eutectic conductive liquid 114 containing suspended magnetic particles extends up a length corresponding to the voltage difference between the electrodes 116, and the length that the eutectic conductive liquid 114 containing suspended magnetic particles extends causes the inductor coil to have an inductance value based thereon.

The inductor coil 122 of the variable inductor is disposed around the capillary 112, such that the inductor coil 122 wraps around the surface of the capillary 112. In some embodiments, ends of the inductor coil 122 are coupled to the circuit 102, and the inductor coil 122 provides inductance to the circuit 102. As stated, the amount of inductance provided by the inductor coil 122 to the circuit 102 depends on the length the eutectic conductive liquid 114 containing suspended magnetic particles extends from the negative electrode 116a to the positive electrode 116b inside the capillary 112. The inductor coil 122 can have a maximum inductance of the inductor coil based on the number of coils of the inductor coil 122 disposed around the capillary 112, and in some embodiments, the inductor coil 122 can have any number of coils to provide any amount of inductance.

Because the capillary 112 relies on capillary action and an applied DC voltage to extend or shrink the eutectic conductive liquid 114 containing suspended magnetic particles, in one embodiment, the eutectic conductive liquid 114 containing suspended magnetic particles does not move in response to the pull of gravity. That is, if the variable conductor is inverted where the negative electrode 116a is above the positive electrode 116b and gravity pulls the eutectic conductive liquid 114 containing suspended magnetic particles toward the positive electrode 116b, the eutectic conductive liquid 114 containing suspended magnetic particles does not extend down unless a forward biased DC voltage is applied between the electrodes 116. That is, unless the positive electrode 116b has a greater voltage than the negative electrode 116a. In one embodiment, the control circuit 106 reverse biases the electrodes 116 (when no connection between the electrodes is desired) which prevents gravity (or the capillary action) from extending the length of the eutectic conductive liquid 114 containing suspended magnetic particles in the capillary 112 regardless of the orientation of the variable inductor 110. If the variable inductor 110 is mounted in a fixed device (e.g., a device that would not be rotated during operation), then the electrodes may not be reverse biased since gravity holds in the eutectic conductive liquid 114 containing suspended magnetic particles in the default (non-connected) state illustrated in FIG. 1.

The eutectic conductive liquid 114 can be a gallium alloy (e.g., EGaIn) but is not limited to such. The eutectic conductive liquid 114 can be any conductive material that is a liquid at room temperature and can be predictively controlled using an applied voltage. However, for simplicity, the remaining discussion assumes the eutectic conductive liquid is EGaIn.

In some embodiments, the eutectic conductive liquid 114 includes magnetic particles (e.g., made from ferrous materials) suspended in the eutectic conductive liquid 114. The magnetic particles are combined in the eutectic conductive liquid 114 to make a mixture in which the magnetic particles are suspended throughout the eutectic conductive liquid.

That is, when the eutectic conductive liquid 114 extends or shrinks inside the capillary 112, the magnetic particles also moves with the eutectic conductive liquid 114. The magnetic particles can have an equal density throughout the eutectic conductive liquid 114, so that inductance can be precisely controlled. That is, extending the eutectic conductive liquid 114 containing suspended magnetic particles toward the positive electrode 116b moves more of the suspended magnetic particles within the center of the inductor coil 122, thereby increasing the inductance of the inductor coil 122. The combination of the eutectic conductive liquid 114 and the magnetic particles suspended therein can form a slurry inside the capillary 112. The magnetic particles can be zinc, iron, steel, nickel, and/or any combination thereof.

In some embodiments, the capillary comprises an annulus in which the eutectic conductive liquid 114 is disposed. The annulus can be a cylindrical annulus, and can have any width. The width of the capillary 112 in which the eutectic conductive liquid 114 and the electrolyte will be disposed can vary, but should be selected so that a capillary action can be used to extend or shrink the eutectic conductive liquid 114 within the capillary 112 as described above. Additionally, although silicone can be used for construction of the capillary 112, any material can be used to form the sides of the capillary 112 as long as the material permits the capillary action described above. Other suitable materials include rubber or polytetrafluorethylene-based materials. In some embodiments, the eutectic conductive liquid 114 containing suspended magnetic particles is sealed into the capillary 112 so that the electrolyte 118 and the eutectic conductive liquid 114 containing suspended magnetic particles cannot escape the capillary regardless of the orientation of the variable inductor 110. To seal the second end of the capillary 112 and electrically connect the positive electrode 116b, solder is formed around the capillary 112 and the positive electrode 116b. In one embodiment, the solder provides a dual purpose by holding the positive electrode 116b in place to seal the second end of the capillary 112 (and prevent the electrolyte 118 and eutectic conductive liquid 114 from escaping) as well as electrically connecting the positive electrode 116b to a landing. Although not shown, the landing may be electrically connected to the bias circuit 104, and accordingly the control circuit 106, both of which drive a DC voltage to the positive electrode 116b.

In some embodiments, the capillary 112 is formed as an annulus with an open first end and an open second end. In such embodiments, the electrodes 116 can seal the open first end and the open second end and seal the eutectic conductive liquid 114 containing suspended magnetic particles and electrolyte 118 inside the capillary 112. In other embodiments, the capillary 112 is formed as an annulus with a closed first end and open second end. In such embodiments, because the first end of the capillary 112 is not open like the second end of the capillary 112, the negative electrode 116a is pushed through the closed first end of the capillary 112. As mentioned, the capillary 112 can be constructed using silicone, and inserting the negative electrode 116a through the silicone can also be self-sealing so that inserting the negative electrode 116a through the closed first end does not create a path through which the eutectic conductive liquid 114 containing suspended magnetic particles and the electrolyte 118 can leak. In some embodiments, the first end of the capillary 112 can nonetheless be sealed by soldering the negative electrode 116a to a landing, which in turn electrically connects to the bias circuit 104, and, accordingly, the control circuit 106. In this manner, both circuits 104, 106 can drive DC voltages onto the negative electrode 116a and the positive electrode 116b to control the length at which the eutectic conductive liquid 114 extends through the capillary 112. In similar embodiments, the capillary 112 is formed as an annulus with an open first end and a closed second end, and as such the same techniques can be applied with the positive electrode 116b.

In some embodiments, the diameter of the negative electrode 116a may be approximately the same as the diameter of the annulus of the capillary 112 so that the negative electrode 116b can be pressed down into the annulus of the capillary 112. Although a portion of the positive electrode 116b is in the annulus, the positive electrode 116b can nonetheless be solder bonded or wire bonded to a landing which may be electrically connected to the bias circuit 104. Similarly, in some embodiments, the diameter of the negative electrode 116a may also be approximately the same as the diameter of the annulus of the capillary 112 so that the negative electrode 116a can be pressed into the annulus of the capillary 112.

Moreover, while FIG. 1 illustrates using a variable inductor 110 with a capillary 112 with an eutectic conductive liquid 114 containing suspended magnetic particles and connected to a tuning circuit 102, the embodiments herein are not limited to such. In another embodiment, the variable inductor 110 may be used in DC-DC power converters, power filters, RF filters, and any other circuit element that benefits from adjusting inductance value of an inductor.

Figure 2:
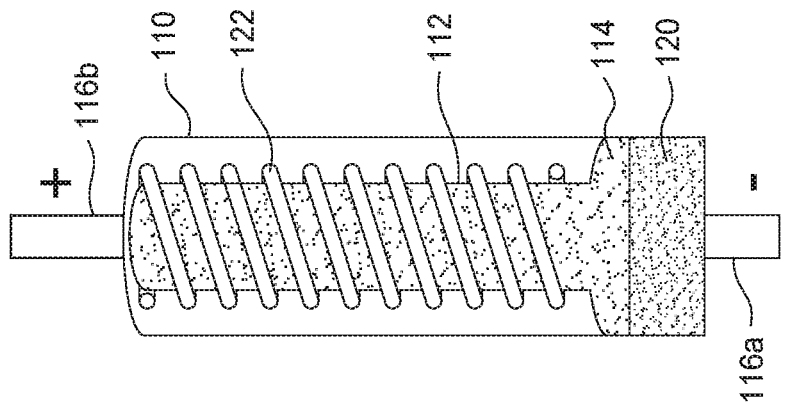
FIG. 2 illustrates a cross section of the variable inductor when forward biased and the eutectic conductive liquid does not extend into the capillary, according to one embodiment described herein.
Figure 3:
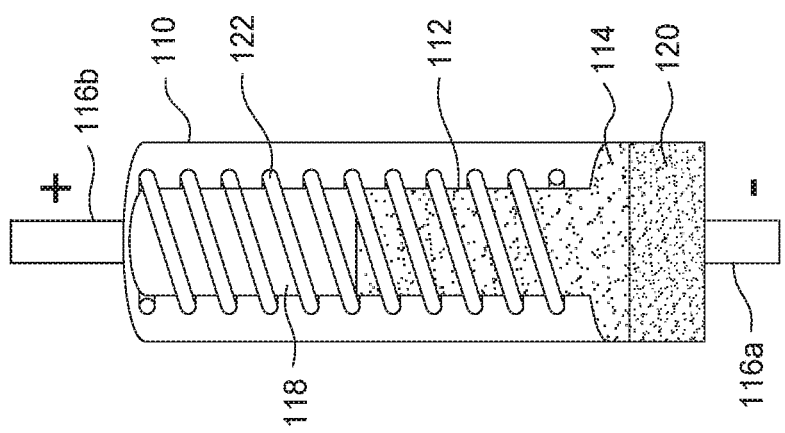
FIG. 3 illustrates a cross section of the variable inductor when the eutectic conductive liquid extends half the length of the capillary, according to one embodiment described herein.
Figure 4:
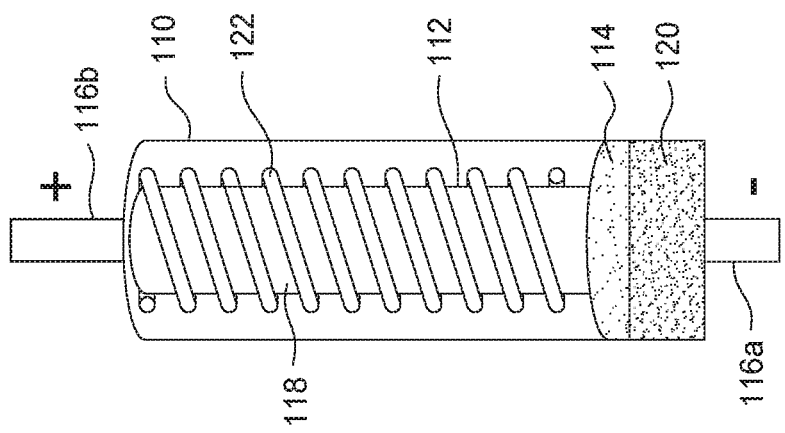
FIG. 4 illustrates a cross section of the variable inductor when the eutectic conductive liquid extends the length of the capillary, according to one embodiment described herein.

FIGS. 2-4 illustrate a variable inductor with different forward voltage biases applied to the electrodes 116 and thereby resulting in different inductance values of the variable inductor 110, according to one embodiment described herein. While FIGS. 2-4 illustrate three different voltage biases, any voltage bias can be applied to the electrodes 116 of the variable inductor 110 in order to result in any corresponding inductance in the inductor coil 122.

FIG. 2 illustrates a cross section of the variable inductor 110 when reverse biased and the eutectic conductive liquid 114 containing suspended magnetic particles does not extend into the capillary 112. When reverse biased, the eutectic conductive liquid 114 does not extend toward the positive electrode 116b and the inductor coil 122 has its lowest inductance or impedance. In some embodiments, the capillary 112 of the variable inductor 110 comprises a reservoir 120 of eutectic conductive liquid 114 containing suspended magnetic particles disposed at one end of the capillary proximate to the negative electrode 116a, and when the variable inductor 110 is reverse biased, the eutectic conductive liquid 114 containing suspended magnetic particles remains in the reservoir 120. In such embodiments, the inductor coil 122 is not disposed around the reservoir 120 so that the magnetic particles suspended in the liquid 114 have little or no effect on the inductance of the inductor FIG. 3 illustrates a cross section of the variable inductor 110 when the eutectic conductive liquid 114 containing suspended magnetic particles extends half the length of the capillary 112, and FIG. 4 illustrates a cross section of the variable inductor 110 when the eutectic conductive liquid 114 containing suspended magnetic particles extends the length of the capillary 112. As mentioned, the variable inductor 110 has a maximum inductance based on the number of coils of the inductor coil 122, and so when the eutectic conductive liquid 114 containing suspended magnetic particles extends the length of the capillary 112, which is also the maximum height of the eutectic conductive liquid 114, the inductance of the variable inductor is equal to the maximum inductance of the inductor coil 122. When the eutectic conductive liquid 114 containing suspended magnetic particles extends half the length of the capillary 112 to the positive electrode 116*b*, the variable inductor 110 has an inductance equal to half the maximum inductance of the variable inductor 110.

In some embodiments, the inductance of the variable inductor 110 can be determined from the following equation:

$$\frac{L}{N^2} \times A = \frac{(height1 \times \mu 1) + (height2 \times \mu 2)}{height1 + height2}$$

In the above equation, µ1 represents the permeability of the electrolyte, µ2 represents the permeability of the eutectic conductive liquid 114, height1 represents the length of the capillary 112 in which the electrolyte 118 resides, height2 represents the length of the capillary 112 in which the eutectic conductive liquid 114 extends, and L represents inductance of the inductor coil, N represents the number of turns in the inductor coil, and A represents the area of the inductor coil 122. In some embodiments, the permeability of the electrolyte is greater than one H/m. In some embodiments, the permeability of the eutectic conductive liquid 114 is greater than one H/m. In some embodiments, the combination of the eutectic conductive liquid 114 and the magnetic particles therein has permeability greater than one H/m.

Figure 5:
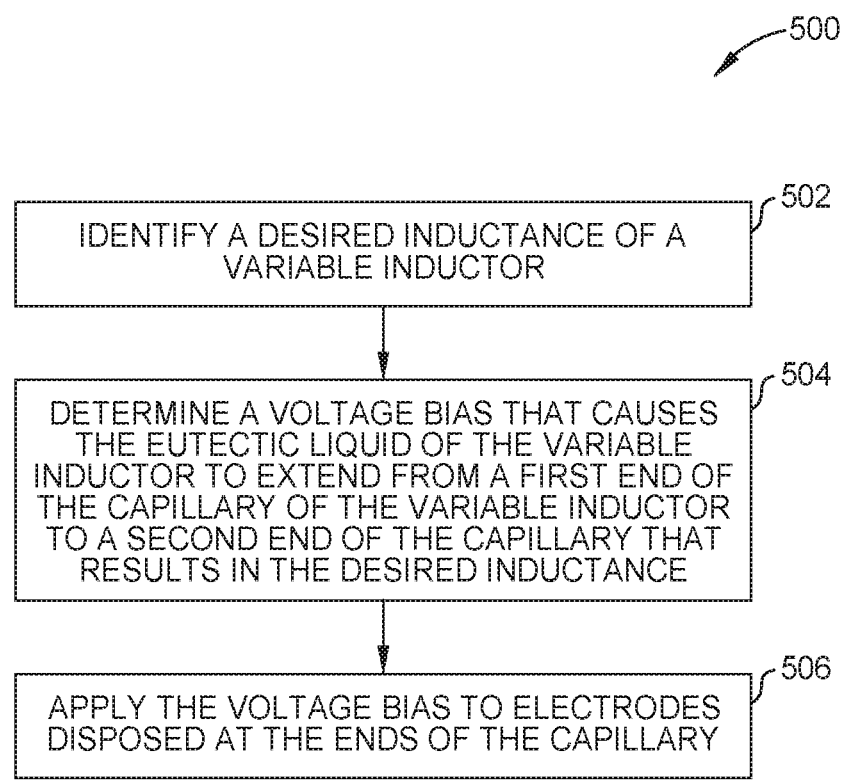
FIG. 5 illustrates a flowchart for using a variable inductor, according to one embodiment described herein.

FIG. 5 illustrates a flowchart for using a variable inductor, according to one embodiment described herein. In one embodiment, the variable inductor 110 is connected to a circuit (e.g., tuning circuit 102) and is used to provide inductance to the circuit.

At block 502, the control circuit 106 identifies a desired inductance of the variable inductor 110. The variable inductor 110 comprises a capillary 112, an inductor coil 122 wrapped around the capillary 112, and an eutectic conductive liquid 114 disposed inside the capillary 112 containing suspended magnetic particles. In some embodiments, an electrolyte 118 is also disposed inside the capillary 112, and the electrolyte 118 and the eutectic conductive liquid 114 remain separate substances inside the capillary 112.

At block 504, the control circuit 106 determines a voltage bias for the variable inductor 110 based on the desired inductance. The determined voltage bias causes the eutectic conductive liquid 114 to extend from a first end of the capillary 112 to a second end of the capillary 112, which results in the desired inductance. In some embodiments, the control circuit 106 determines a length the eutectic conductive liquid 114 containing suspended magnetic particles should extend from the first end of the capillary 112 to the second end of the capillary 112 in order achieve the desired inductance in the inductor coil 122 of the variable inductor 110. In further embodiments, the control circuit 106 determines the voltage bias based on the determined length of the eutectic conductive liquid 114 containing suspended magnetic particles.

At block 506, the control circuit 106 applies the determined voltage bias to the electrodes 116 disposed at the first and second ends of the capillary. In some embodiments, the control circuit 106 instructs the bias circuit to apply or remove the determined voltage bias to the electrodes 116. Accordingly, the applied voltage bias results in a voltage difference between the electrodes 116, and the eutectic conductive liquid 114 extends in the capillary 112 based on the voltage difference between the electrodes 116, resulting in the desired inductance in the inductor coil 122 of the variable inductor 110.

As used herein and in the claims, "at least one of A and B" covers the options of only A, only B, and the combination of A and B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A variable inductor comprising:
    a capillary comprising a side surface forming an annulus, wherein an eutectic liquid is disposed within the annulus formed by the side surface, the eutectic liquid comprising suspended magnetic particles;
    a first electrode disposed at a first end of the capillary;
    a second electrode disposed at a second end of the capillary; and
    an inductor coil disposed around the capillary.

2. The variable inductor of claim 1, wherein the magnetic particles comprise ferrous material.

3. The variable inductor of claim 2, wherein the eutectic liquid comprises a permeability greater than 1.

4. The variable inductor of claim 1, wherein the capillary comprises a reservoir of the eutectic liquid.

5. The variable inductor of claim 4, wherein the inductor coil is not disposed around the reservoir.

6. The variable inductor of claim 1, wherein the eutectic liquid has a maximum height equal to a length of the capillary.

7. The variable inductor of claim 1, wherein applying a voltage bias to the first electrode and the second electrode causes the eutectic liquid to extend within the capillary from the first end of the capillary toward the second end of the capillary.

* * * * *